(12) United States Patent
Oh

(10) Patent No.: US 6,762,086 B2
(45) Date of Patent: Jul. 13, 2004

(54) METHOD FOR FABRICATING SEMICONDUCTOR DEVICE WITH TRIPLE WELL STRUCTURE

(75) Inventor: Jae-Geun Oh, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/331,976

(22) Filed: Dec. 31, 2002

(65) Prior Publication Data

US 2004/0014264 A1 Jan. 22, 2004

(30) Foreign Application Priority Data

Jul. 19, 2002 (KR) ................................ 10-2002-0042293

(51) Int. Cl.[7] .......................................... H01L 21/8238
(52) U.S. Cl. ...................................... 438/199; 438/228
(58) Field of Search ................................ 438/199, 197, 438/200, 217, 228

(56) References Cited

U.S. PATENT DOCUMENTS

| 6,097,068 A | 8/2000 | Brown et al. |
| 6,268,256 B1 | 7/2001 | Kuo |
| 6,287,908 B1 | 9/2001 | Brand |
| 6,351,017 B1 | 2/2002 | Fang et al. |
| 6,410,399 B1 | 6/2002 | Flaitz et al. |
| 6,448,141 B1 | 9/2002 | Ahmad et al. |
| 6,468,852 B1 | 10/2002 | Gonzalez et al. |

FOREIGN PATENT DOCUMENTS

| JP | 07-235670 A | 9/1995 |
| JP | 10-294443 A | 11/1998 |
| JP | 11-274496 A | 10/1999 |

OTHER PUBLICATIONS

Bourdelle, K.K. et al. "The effect of triple well implant dose on performance of NMOS transistors" IEEE Trans. Electr/Dev. vol. 49, No 3, Mar. 2002.*

* cited by examiner

Primary Examiner—Craig A. Thompson
(74) Attorney, Agent, or Firm—Birch, Stewart, Kolasch & Birch, LLP

(57) ABSTRACT

A method for fabricating a semiconductor device, includes the steps of forming a triple well including a first conductive type well in a semiconductor substrate, wherein a cell transistor is to be formed on the first conductive type well, sequentially forming a gate oxide layer and a gate electrode on a triple well, forming a source/drain region in the first conductive type well by implanting second conductive type dopant and forming a threshold voltage ion implantation region beneath the gate electrode by implanting first conductive type dopant to the first conductive type well with a ion implantation energy enough to pass through the gate electrode, wherein the threshold voltage ion implantation region surrounds the source/drain region.

14 Claims, 10 Drawing Sheets

DEEP PUNCH PATH

US 6,762,086 B2

METHOD FOR FABRICATING SEMICONDUCTOR DEVICE WITH TRIPLE WELL STRUCTURE

This nonprovisional application claims priority under 35 U.S.C. §119 (a) on Patent Application No. 2002-42293 filed in KOREA on Jul. 19, 2002, which is herein incorporated by reference.

FIELD OF THE INVENTION

The present invention relates to a method for fabricating a semiconductor device; and, more particularly, to a method for fabricating a semiconductor device having an improved refresh characteristic with a triple well structure.

DESCRIPTION OF RELATED ART

Generally, semiconductor products are manufactured by a complementary metal-oxide-semiconductor field effect transistor (CMOSFET) technology, that is two kinds of field effect transistor, i.e., NMOSFET and PMOSFET, are configured on one wafer. In order to manufacture the NMOSFET and PMOSFET on one wafer at the same time, a well formation technology is required to divide the NMOSFET and PMOSFET.

A typical well formation technology requires a thermal treatment process of a high temperature for a long time after an ion-implantation process is carried out with a low energy. Since the well formation technology requires a thermal treatment for a long time, there is a disadvantage for an aspect of a semiconductor device fabrication cost and, since a doping concentration of the ion is uniformly decreased in a vertically downward direction from a surface of a wafer. Thus, a control of the semiconductor device is limited.

A profiled well formation technology is recently tried to solve the above problems. In accordance with the profiled well formation technology, a ions are implanted with high-energy to a desired depth, and then a simple thermal treatment process is carried out in order to prevent punchthrough, latch-up and the like.

The well formation technology is classified with a twin-well and a triple well according to the number of kinds of wells formed on one wafer. The triple well is composed of two p-wells and one deep n-well surrounding one of the p-wells. The triple well has advantages that a property of an NMOSFET formed on the p-well can be differently controlled and the NMOSFET has a good property against an external noise. Accordingly, the well formation technology is recently changed from a diffusion twin-well process to the profiled triple well process.

Generally, the NMOSFET formed on the p-well, which is surrounded by the n-well of the triple well, is used as a cell transistor. As a gate length of the cell transistor is decreased, threshold voltage thereof is also decreased, so that a threshold voltage roll-off is caused. Namely, a threshold voltage distribution is broadened with a lack of uniformity. The threshold voltage distribution is broadened, since gate length variation is increased as a size of the transistor becomes smaller and a threshold voltage roll-off of a small transistor is increased. Therefore, in order to secure a uniform characteristic of a cell transistor, it is preferable to have uniform threshold voltage distribution and to solve the threshold voltage roll-off.

FIGS. 1A to 1E are cross sectional views illustrating a fabrication process of a semiconductor device having a triple well according to the prior art.

Referring to FIG. 1A, after a field oxide layer 12 is formed through a, shallow trench isolation (STI) on a semiconductor substrate 11, a photosensitive layer is coated and a first mask 13 with the photosensitive layer is formed through a patterning process including exposing and developing processes.

Subsequently, the first mask 13 is used as an ion implantation mask, and n-type impurities are implanted into the semiconductor substrate 11 by using a high energy ion implanter. Thus, a first region 14 of a profiled n-well is formed in the semiconductor substrate 11.

Referring to FIG. 1B, a second mask 15 is formed by patterning a photosensitive layer coated on the semiconductor substrate 11 through exposing and developing processes, the second mask 15 is employed as an ion implantation mask and n-type impurities are implanted into the semiconductor substrate 11 by using a high energy ion implanter, so that second and third regions 16 and 17 of a profiled n-well are formed.

The second region 16 of the profiled n-well is a middle n-well ion implantation region and the third region 17 is a p channel field stop ion implantation region. A numeral reference '18' in FIG. 1B shows a doping profile of the profiled n-well.

Referring to FIG. 1C, after stripping the first and second masks 13 and 15, a third mask 19 is formed by patterning a photosensitive layer coated on the semiconductor substrate 11 through exposing and developing processes. The third mask 19 is employed as an ion implantation mask and p-type impurities are implanted into the semiconductor substrate 11 by using a high energy ion implanter, so that first and second regions 20, 21 are formed. The first and second regions 20, 21 represent a p-well ion implantation region and an n-channel field stop ion implantation region, respectively. A numeral reference 22 shows a doping profile of the profiled p-well.

Referring to FIG. 1D, the profiled n-well and p-well are activated through a furnace annealing process, so that a triple well formation process is completed. The triple well is composed of a first p-well 23, a deep n-well 24 adjacent to the first p-well 23, a second p-well 25 surrounded by the deep n-well 24 and positioned at a predetermined distance from the first p-well 23.

A transistor to be formed on the second p-well 25 is independent of a transistor to be formed on the first p-well 23. The second p-well 25 has an advantage that can be protected from an external voltage or noise suddenly applied, because the second p-well 25 is surrounded by the deep n-well 24. For this reason, a cell transistor is formed on the second p-well 25.

A photosensitive layer is coated on the semiconductor substrate 11, in which the triple well is completely formed, and a fourth mask 26, exposing a portion of the semiconductor substrate 11 to form a cell transistor, is formed through a patterning process with exposing and developing the photosensitive layer. Thereafter, p-type impurities are implanted into the overall second p-well 25 to adjust a threshold voltage of the cell transistor by using the fourth mask 26 as an ion implantation mask, so that a threshold voltage ion implantation region 27 is formed.

Referring to FIG. 1E, after removing the fourth mask 26, a gate oxide layer 28 and a gate electrode 29A are formed on a predetermined region of the semiconductor substrate 11, and a spacer 29B is formed on sidewalls of the gate electrode 29A. Thereafter, impurities of n and p types are implanted to form an $n^+$ source/drain region 30A of an NMOSFET and a p+ pocket ion implantation region (source/drain region) 30B for a PMOSFET in a peripheral circuit.

FIG. 2 is a detailed cross sectional view along with line 'X' in FIG. 1E.

Referring to FIG. 2, even though the p-type impurities are implanted to adjust the threshold voltage of the cell transistor according to the prior art as mentioned above, junction loss occurs due to a counter doping effect, since the threshold voltage ion implantation region 27 and the n+ source/drain region of cell junction are mostly overlapped. Thus, resistance and electric field are increased and a refresh time is reduced. Accordingly, reliability of a device is deteriorated.

In order to adjust the threshold voltage necessary to an operation of the cell transistor, pre-determined p-type impurities are required to be implanted in a channel region. If the dose range from the p-type impurities is increased, the threshold voltage is increased as much as required. However, the counter doping effect is considerably increased and a refresh characteristic is became worse. Therefore, there is a problem of selecting one appropriate ion implantation condition between to conditions, for forming the source/drain and adjusting the threshold voltage of the cell transistor, which have a trade-off relation.

FIG. 3 is a graph showing dopant profiles analyzed with secondary ion mass spectrometer (SIMS) after carrying out a thermal treatment process for the threshold voltage ion implantation region and the source/drain region.

Referring to FIG. 3, in order to adjust a threshold voltage necessary for an operation of the cell transistor, as B or BF2 is implanted with a dose range from 1.5E13 and an ion implantation energy of 30 KeV denoted as 'B' instead of a dose range from 1.0E13 and an ion implantation energy of 20 KeV denoted as 'A', the cell threshold voltage is increased as desired. However, a counting doping effect is severely increased at a Xj portion of a cell junction, so that a doping concentration in the source/drain region is remarkably decreased denoted as 'C'. Therefore, a electric loss is generated and a refresh characteristic of the cell junction is degraded.

In order to solve the above problem, an improved ion implantation process is introduced to reduce resistance and electric field to thereby improve a refresh characteristic. However, in this case, a punch problem of a cell junction is generated.

FIG. 4 is a diagram illustrating a current path.

As shown, a deep punch path exist at a depth of about 1000 Å.

SUMMARY OF THE INVENTION

It is, therefore, an object of the present invention to provide a method for fabricating a semiconductor device, improving a refresh characteristic with a triple well structure.

In accordance with an aspect of the present invention, there is provided a method for fabricating a semiconductor device, comprising the steps of: forming a triple well including a first conductive type well in a semiconductor substrate, wherein a cell transistor is to be formed on the first conductive type well; sequentially forming a gate oxide layer and a gate electrode on a triple well; forming a source/drain region in the first conductive type well by implanting second conductive type dopant; and forming a threshold voltage ion implantation region beneath the gate electrode by implanting first conductive type dopant to the first conductive type well with a ion implantation energy enough to pass through the gate electrode, wherein the threshold voltage ion implantation region surrounds the source/drain region.

In accordance with another aspect of the present invention there is provided a method for fabricating a semiconductor device, comprising the steps of: forming a triple well including a first conductive type well in a semiconductor substrate, wherein a cell transistor is to be formed on the first conductive type well; sequentially forming a gate oxide layer and a gate electrode on the triple well; forming a threshold voltage ion implantation region by implanting a first conductive type dopant into the first conductive type well with an ion implantation energy enough to pass through the gate electrode; and forming a source/drain region by implanting a second conductive type dopant into the triple well, wherein the threshold voltage ion implantation region surrounds the source drain region.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a method for fabricating a semiconductor device capable of improving a refresh characteristic according to the present invention will be described in detail referring to the accompanying drawings.

FIGS. 5A to 5E are cross sectional views showing a fabrication process of a semiconductor memory device with a triple well structure.

Figure 5A:
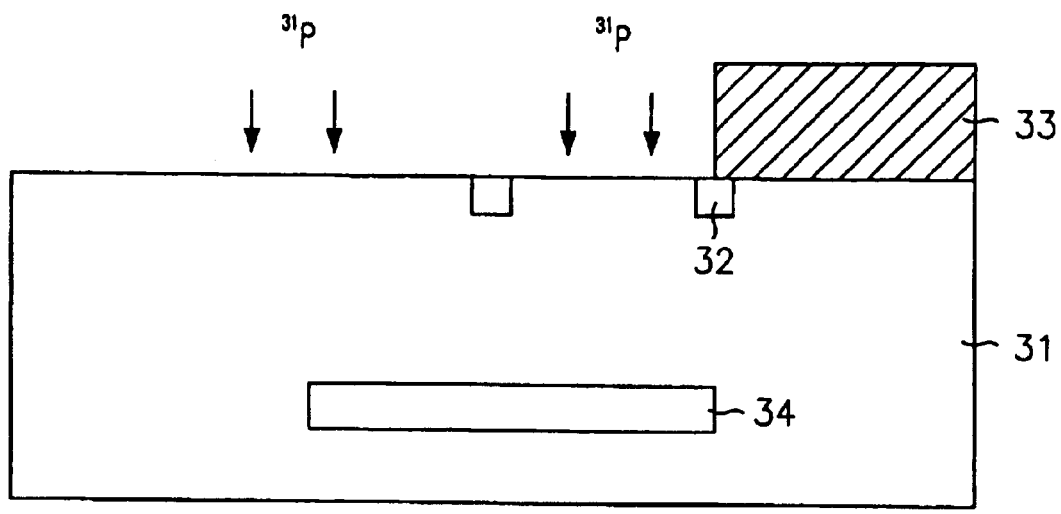
FIGS. 5A to 5E are cross sectional views showing a fabrication process of a semiconductor memory device with a triple well structure in accordance with a first embodiment of the present invention.

Referring to FIG. 5A, after a field oxide layer 32 is formed in a semiconductor substrate 31 for isolating each element by using a shallow trench isolation (STI) process, a first mask 33 is formed through a patterning process including exposing and developing processes after coating a photosensitive layer on the semiconductor substrate 31. Subsequently, $^{31}$p ions, which are n-type dopants, are implanted to an exposed semiconductor substrate 31 by using a high-energy ion implanter to thereby form a deep n-well ion implantation region 34.

The ion implantation process is carried out with an ion implantation energy ranging from about 0.6 MeV to about 1.6 MeV and a $^{31}$P ion dose ranging from about $5\times10^{12}$ ions/cm$^2$ to about $1.5\times10^{13}$ ions/cm$^2$.

Figure 5B:
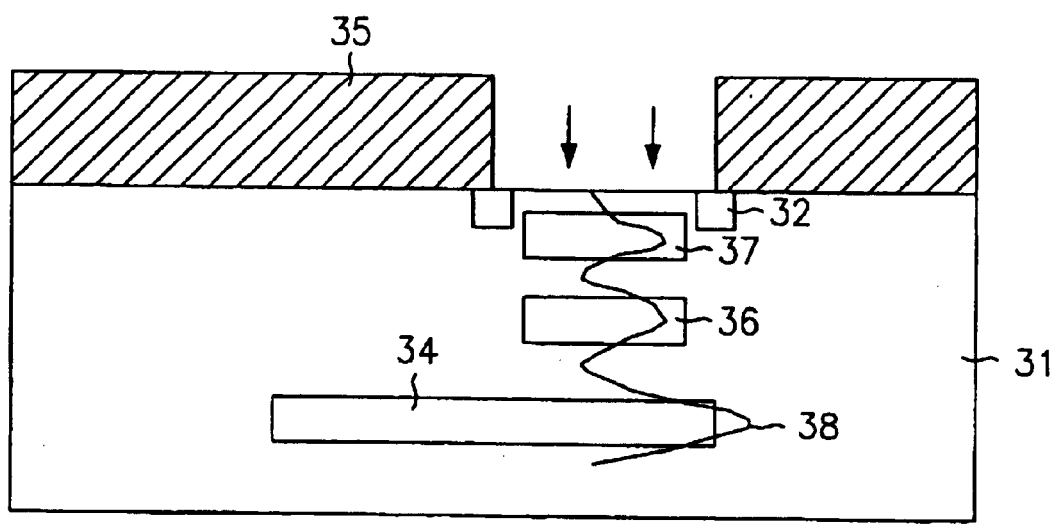

Referring to FIG. 5B, after stripping the first mask 33, a second mask 35 is formed through a patterning process including exposing and developing processes after coating a photo-sensitive layer on the semiconductor substrate 31. N-type dopants are implanted with a high-energy ion implanter by using the second mask 35 as an ion implantation mask to thereby form a middle n well ion implantation region 36 and a p channel field stop ion implantation region 37.

Figure 1A:
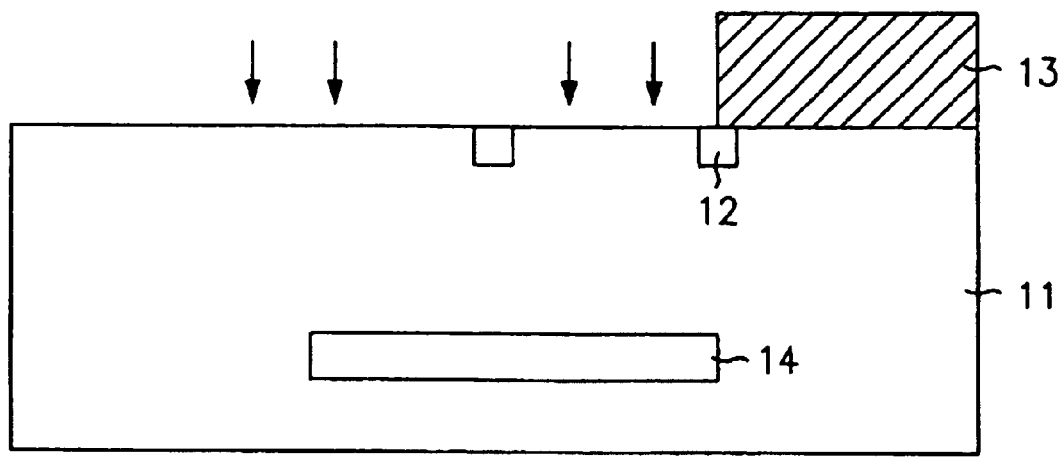
FIGS. 1A to 1E are cross sectional views illustrating a fabrication process of a semiconductor device having a triple well according to the prior art.
Figure 1B:
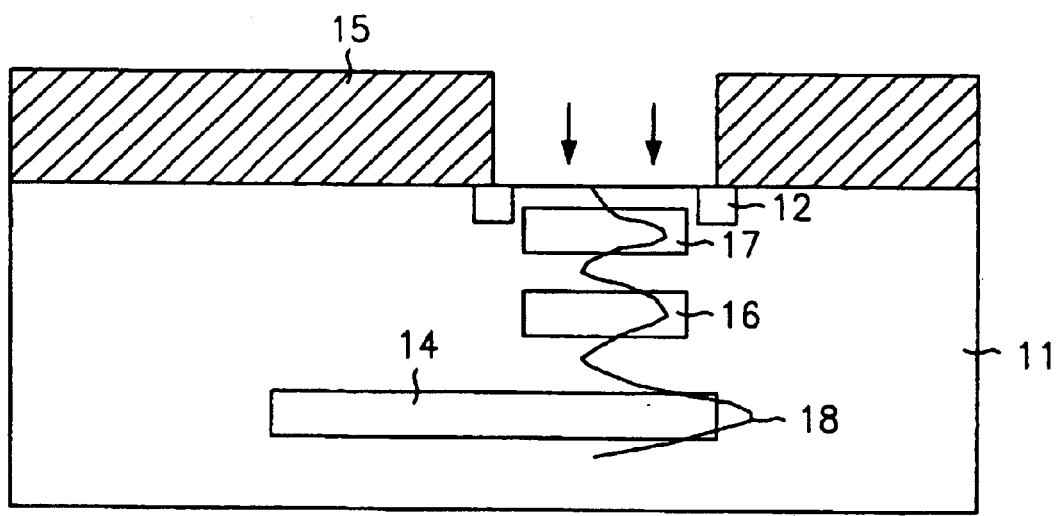
Figure 1C:
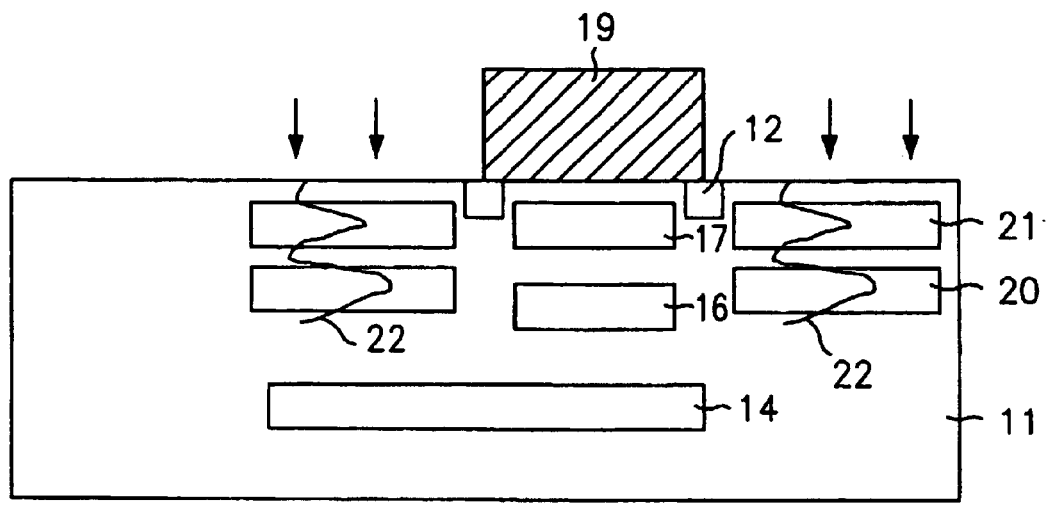
Figure 1D:
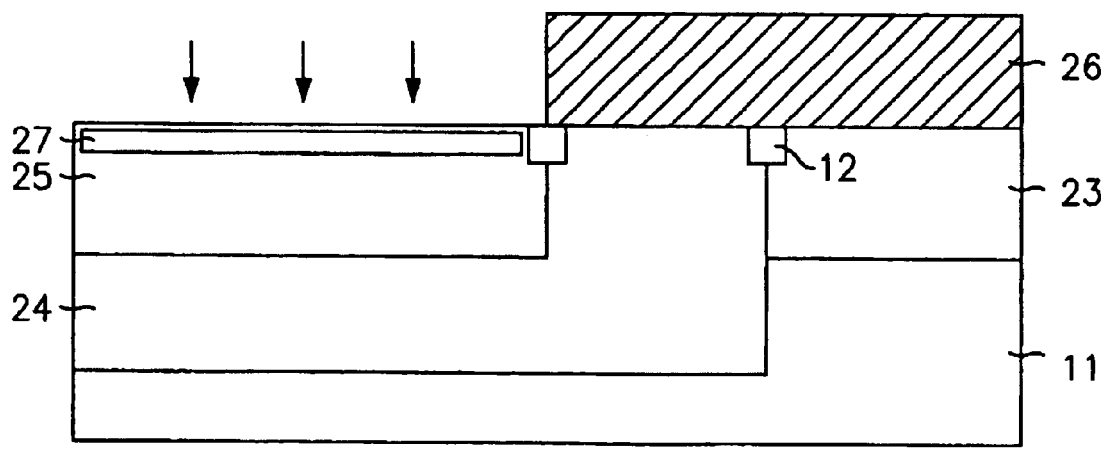
Figure 1E:
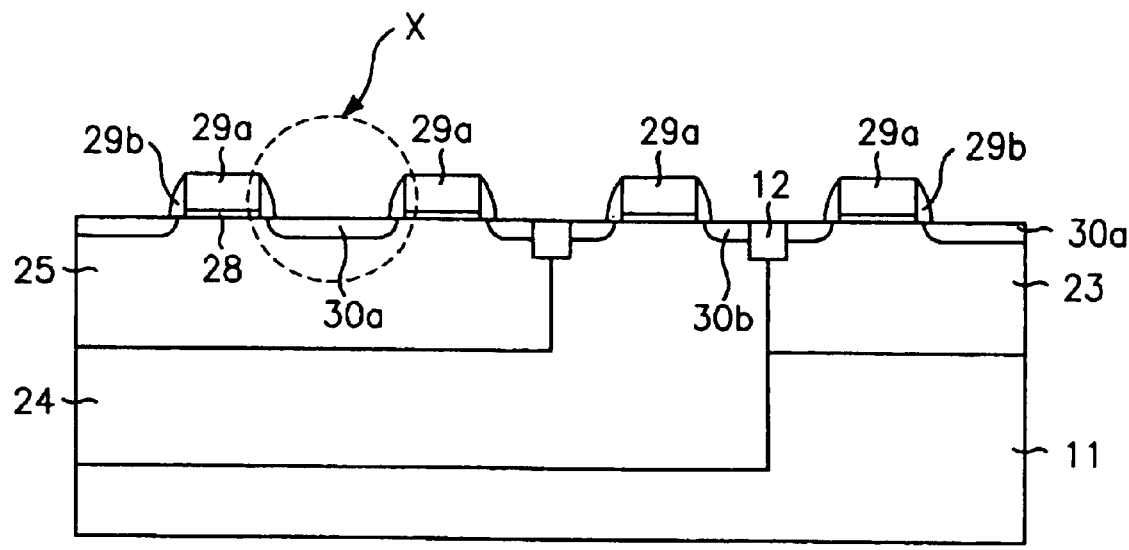
Figure 2:
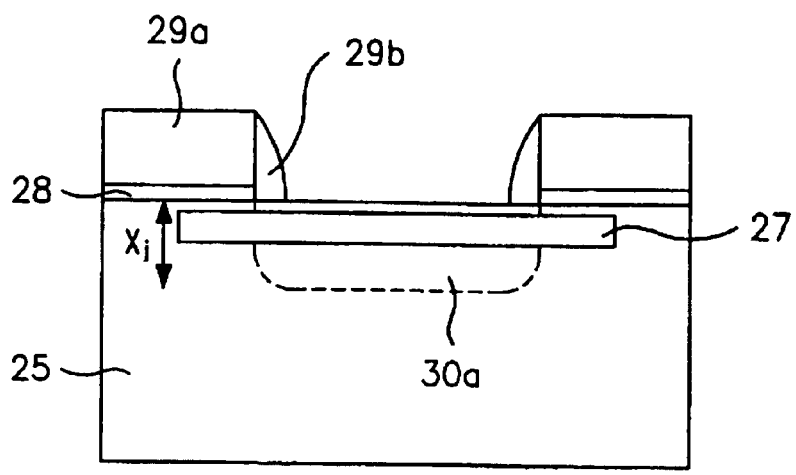
FIG. 2 is a detailed cross sectional view-along with line 'X' in FIG. 1E.
Figure 3:
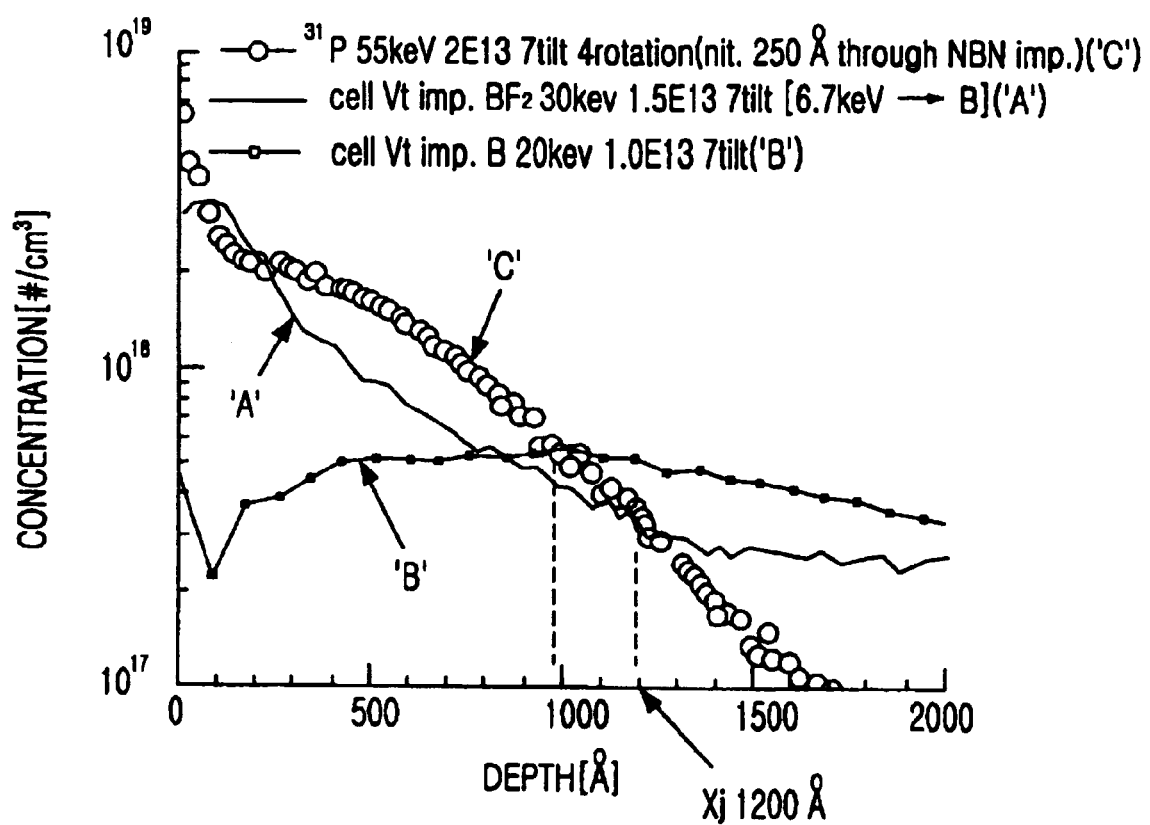
FIG. 3 is a graph showing dopant profiles analyzed with secondary ion mass spectrometer (SIMS) after carrying out a thermal treatment process for the threshold voltage ion implantation region and the source/drain region.
Figure 4:
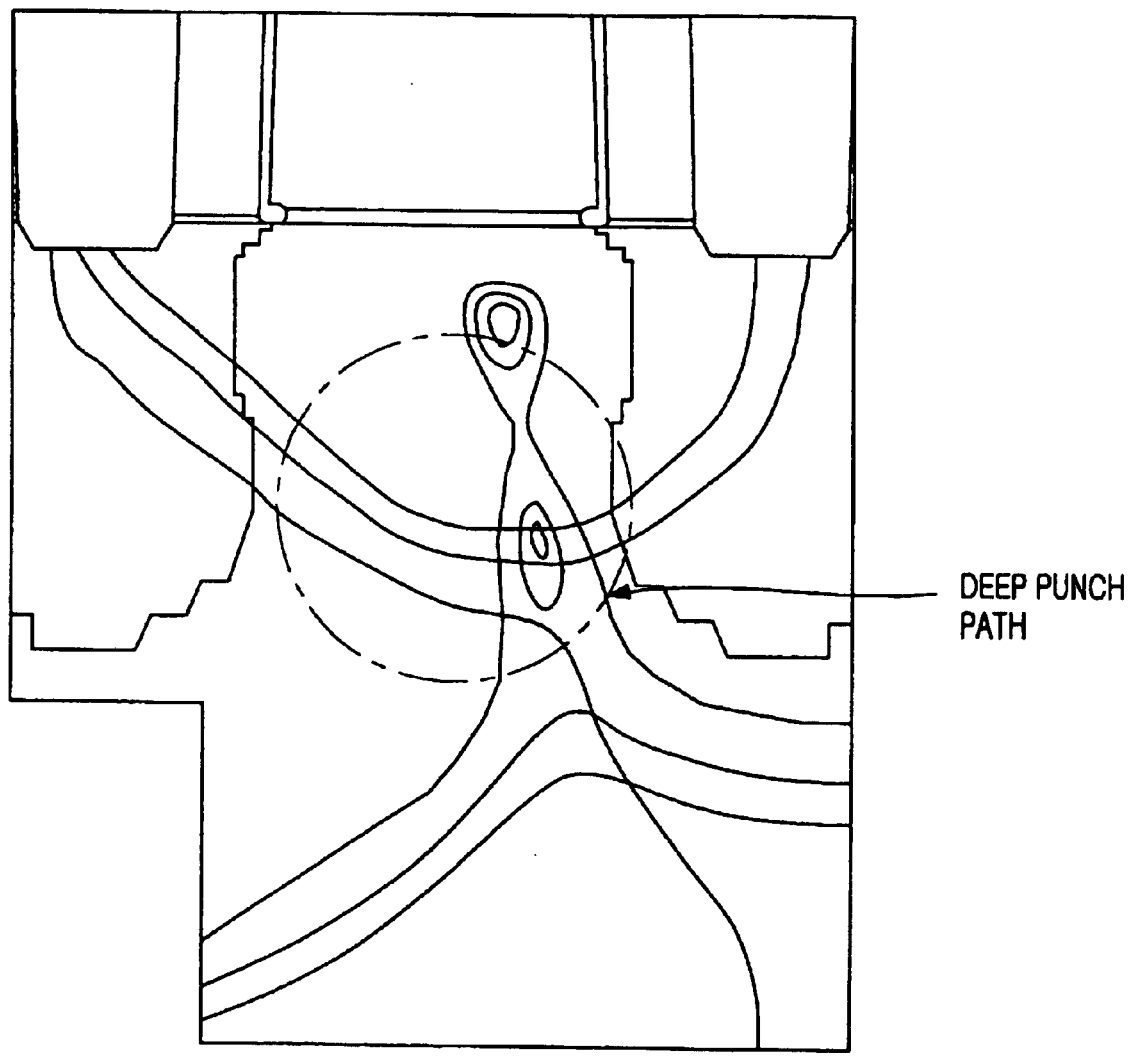
FIG. 4 is a diagram illustrating a current path.

$^{31}$P ions are used at the middle n-well ion implantation process. It is preferable that dose range from the $^{31}$P ions is of about $5\times10^{12}$ ions/cm$^2$ to about $2\times10^{13}$ ions/cm$^2$ and an ion implantation energy is of about 500 keV to about 600 keV. Also, $^{31}$P ions are used at the p channel field stop ion implantation process. It is preferable that dose range from the $^{31}$P ions is of about $5\times10^{11}$ ions/cm$^2$ to about $2\times10^{13}$ ions/cm$^2$ and an ion implantation energy is of about 150 keV to about 300 keV. The n-well ion implantation region 34, the middle n-well ion implantation region 36 and the p channel field stop ion implantation region 37 form a profiled n-well through the above implantation process. The numeral reference '38' denoted in FIG. 4B represents a doping profile of the profiled n-well.

Figure 5C:
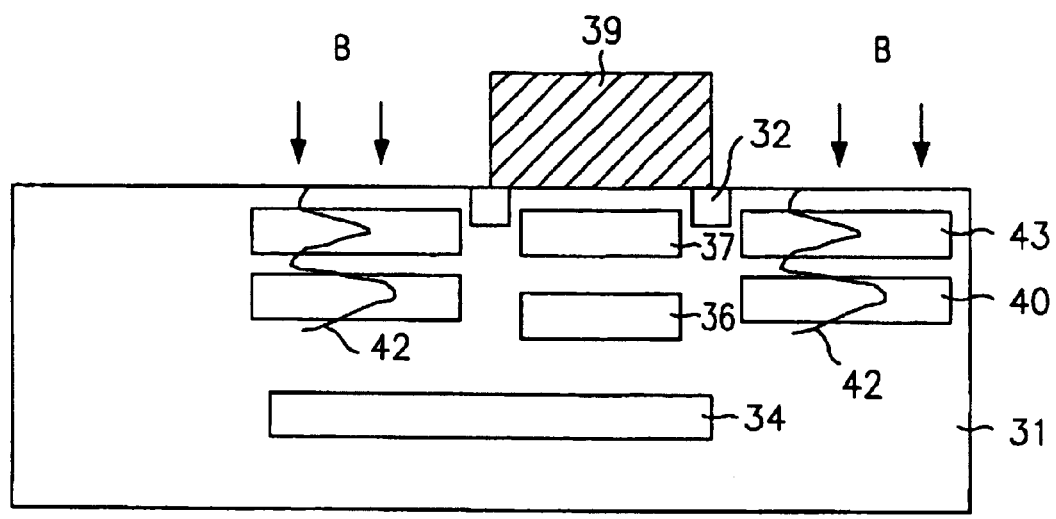
Figure 5D:
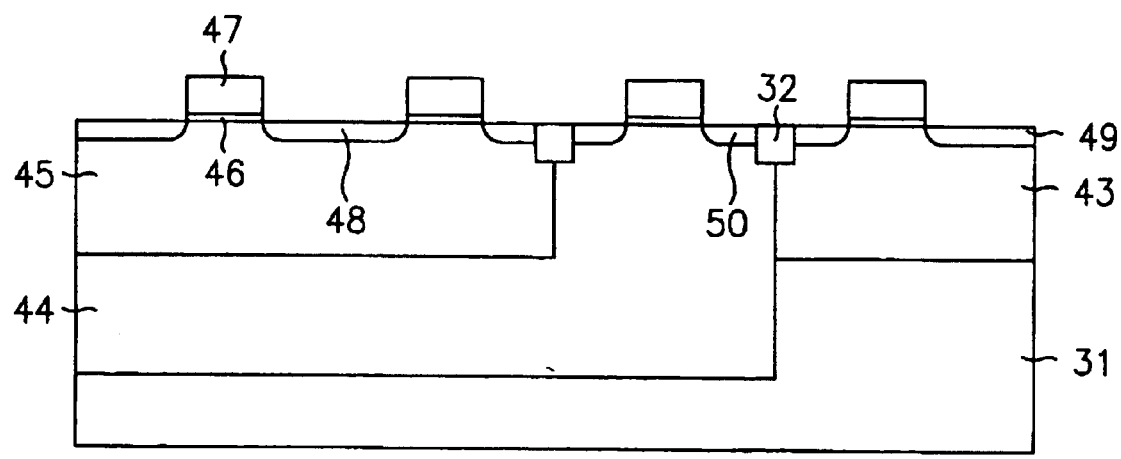

Referring to FIG. 5C, after the second mask 35 is stripped, a third mask 39 is formed by a patterning process with exposing and developing processes after coating a photo-sensitive layer. A p-type dopant is implanted by using the third mask 39 as an ion implantation mask with a high energy ion implanter, so that a p-well ion implantation region 40 and an n-channel field stop ion implantation region 41 are formed. At this time, it preferable that the p-well implantation is carried out with boron (B) of a concentration of about $5\times10^{12}$ ions/cm$^2$ to about $3\times10^{13}$ ions/cm$^2$ and in an ion implantation energy ranging from about 180 keV to about 300 keV. The n-channel field stop ion implantation process is carried out with boron (B) ions of a concentration of about $5\times10^{11}$ ions/cm$^2$ to about $1\times10^{13}$ ions/cm$^2$ and in an ion implantation energy ranging from about 50 keV to about 80 keV. The p-well ion implantation region 40 and the n-channel field stop ion implantation region 41 form a profiled p-well. The numeral reference '42' denoted in FIG. 4C represents a doping profile of the profiled p-well.

Subsequently, referring to FIG. 4C, after the third mask 39 is stripped, the profiled n-well and the dopant implanted in the p-well are activated through a furnace annealing process so that a triple well formation process is completed. The triple well includes a first p-well 43, a deep n-well 44 adjacent to the first p-well 43 and a second p-well 45 surrounded by the deep n-well 44 and positioned at a predetermined distance with the first p-well 43.

A transistor to be formed on the second p-well 45, is independent of a transistor to be formed on the first p-well 43. The second p-well 45 has an advantage that can be protected from an external voltage or noise suddenly applied, because the second p-well 45 is surrounded by the deep n-well 24. For this reason, a cell transistor is to be formed on the second p-well 45.

Thereafter, a source/drain region 48 is formed in the cell transistor by performing a blanket ion implantation process with an n-type dopant without a mask process. A light doped drain (LDD) region 49 is formed a region to form an nMOSFET and a pocket region 50 is formed in a region to form a pMOSFET. An ion implantation process of an n-type impurity is carried out with p or As of dose ranging from about $1\times10^{13}$ ions/cm$^2$ to about $5\times10^{13}$ ions/cm$^2$.

Referring to FIG. 4E, a photosensitive layer is coated on the semiconductor substrate 31, which the source/drain region 48, the LDD region 49 and the pocket region are formed, and a fourth mask 51 is formed through a patterning process with exposing and developing processes. The fourth mask 46 exposes a portion of the semiconductor substrate 31, i.e., the second p-well 45, on which a cell transistor is to be formed. The fourth mask 51 is used a photosensitive layer for a high energy ion implantation process and the fourth mask is formed with a density of about 1 g/cm$^3$ to about 10 g/cm$^3$ and a thickness of over 1.0 μm.

After forming the fourth mask 51, p-type impurities are implanted into the overall second p-well 45 to adjust a threshold voltage of the cell transistor by using the fourth mask 51 as an ion implantation mask, so that a threshold voltage ion implantation region 52 is formed at a lower portion of a gate electrode 47. At this time, the p-type implantation process is also carried out beneath the source/drain region 48. Therefore, a threshold voltage ion implantation region is formed. Hereinafter, this is called a p-type punch protection region 53.

As mentioned above, in order to form the threshold voltage ion implantation region 52 beneath the gate electrode 47, a p-type dopant has to be implanted with a high ion implantation energy enough to pass through the gate electrode 47. An ion implantation energy capable of passing through a gate oxide layer 46 and the gate electrode, which have a thickness of over 3000 Å.

When the p-type ion implantation process is carried out with a high ion implantation energy enough to pass through the gate electrode 47, since the threshold voltage ion implantation region has to be formed to a channel of the cell transistor, the ion implantation energy has to be adjusted. Also, since the p-type punch protection region 53 is formed at a deeper portion than the source/drain region 48 by implanting the p-type dopant with a high ion implantation energy in the source/drain region 48, which the gate electrode does not exit, a counter doping effect can be prevented with the source/drain region 48.

$^{11}$B or $^{49}$BF$_2$ ions are used as the p-type dopant to formed to the threshold voltage ion implantation region 52 and the p-type punch protection region 53. When the $^{11}$B ions are used, the p-type ion implantation process is carried out with $^{11}$B ions in a concentration of about $5\times10^{12}$ ions/cm$^2$ to about $5\times10^{13}$ ions/cm$^2$ and in an ion implantation energy ranging from about 80 KeV to about 160 KeV. When the $^{49}$BF$_2$ ions are used, the p-type ion implantation process is carried out with $^{49}$BF$_2$ ions in a concentration of about $5\times10^{12}$ ions/cm$^2$ to about $5\times10^{13}$ ions/cm$^2$ and in an ion implantation energy ranging from about 350 KeV to about 710 KeV.

Figure 5E:
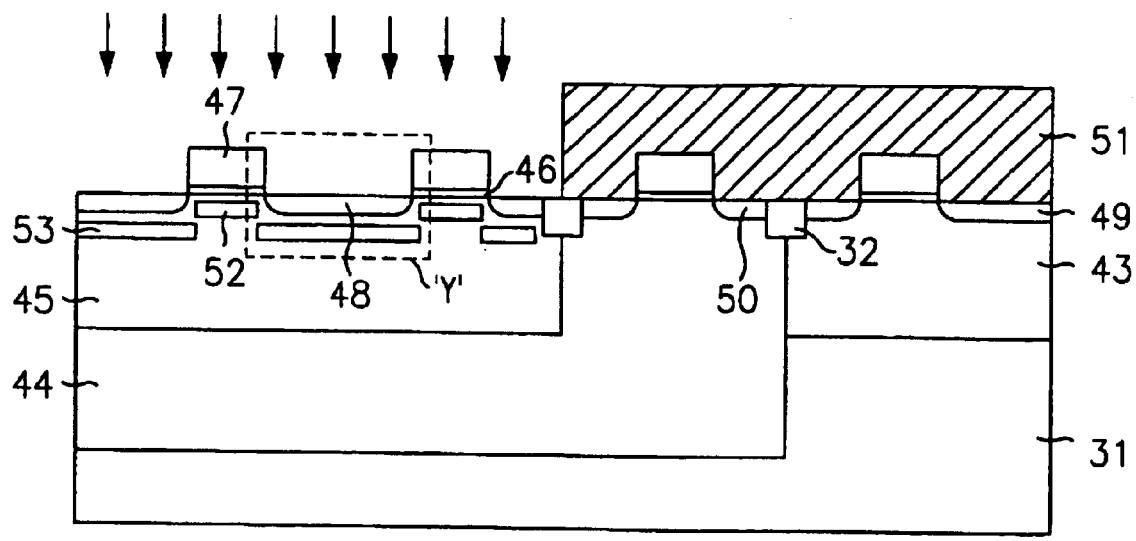
Figure 6:
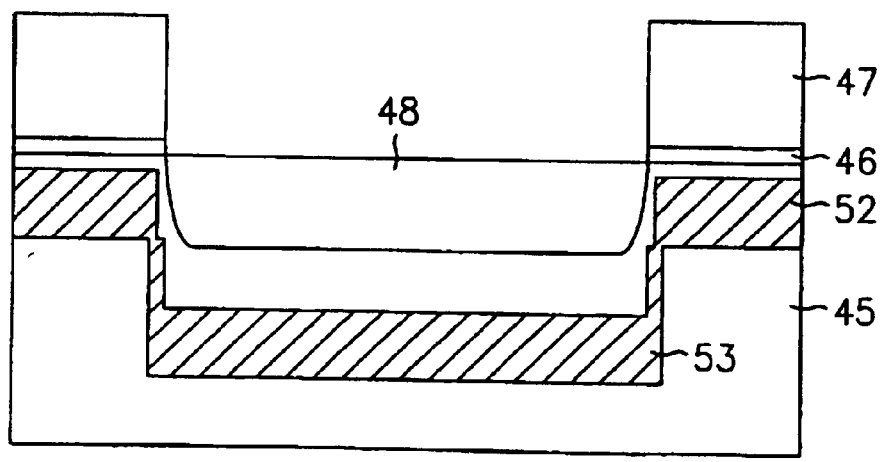
FIG. 6 is a detailed cross sectional view showing 'Y' in FIG. 5E.

FIG. 6 is a detailed cross sectional view showing 'Y' in FIG. 5E.

Referring to FIG. 6, the gate oxide layer 46 and the gate electrode 47 are formed on predetermined portions on the second p well 45 in the triple well structure and the threshold voltage ion implantation region 52 is formed beneath the gate oxide layer 46. The source/drain region 48 is formed at edge portions of the gate electrode 47 in the second p well 45 and the punch protection region 53 is formed beneath the source/drain region 48.

After forming the gate electrode 47 and the source/drain region 48, since the p-type dopant of B or BF$_2$ ions is implanted to overall second p well 45 with a high ion implantation energy to pass through the gate electrode 47, the threshold voltage ion implantation region 52 is formed electrode to have a channel characteristic beneath the gate 47. At this time, since the ion implantation process is carried out with a high ion implantation energy, the threshold voltage ion implantation region is not overlapped with the source/drain region 48. Namely, since the p-type dopant for the threshold voltage ion implantation region 52 is implanted beneath the source/drain region 48 different from the conventional threshold voltage ion implantation region overlapped with the source/drain region 48, the counter dopping effect can be prevented between the source/drain region 48 and the threshold voltage ion implantation region 52. Accordingly, junction loss of the source/drain region 48 having a junction depth of Xj can be prevented, so that resistance increase and electric field increase are suppressed.

Also, since the threshold voltage ion implantation region 52 and the p-type punch protection region 53 beneath the source/drain region 48 are formed at the same time, that is to say, the source/drain region 48, which is a cell junction, is surrounded by the threshold voltage ion implantation region 52 and the p-type protection region 53, a deep punch characteristic of the cell transistor can be controlled.

Figure 7A:
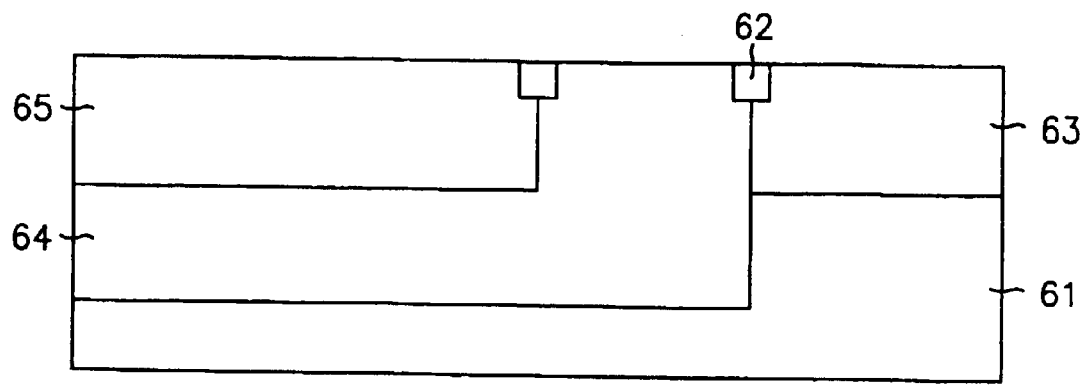
FIGS. 7A to 7C are cross sectional views showing a fabrication process of a semiconductor device in accordance with a second embodiment of the present invention.
Figure 7B:
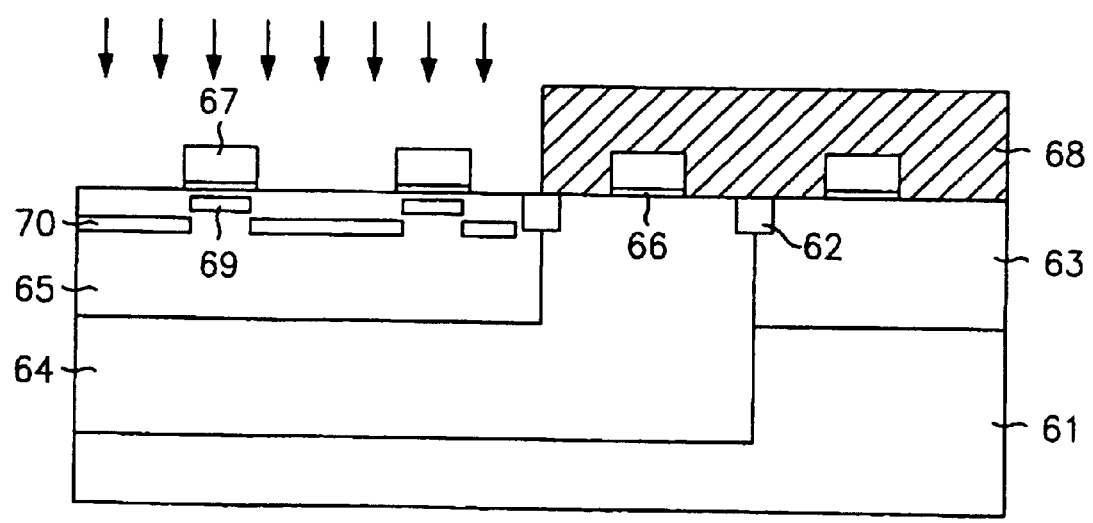
Figure 7C:
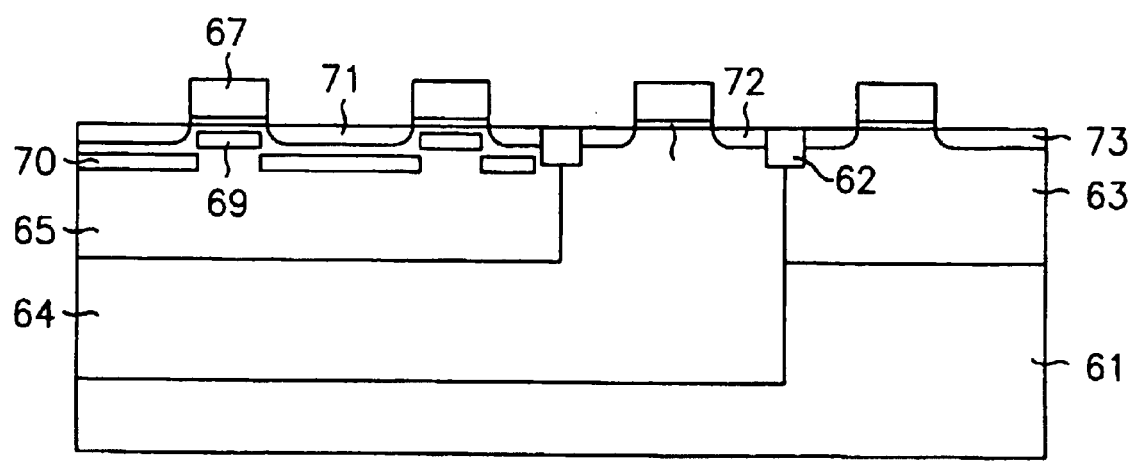

FIGS. 7A to 7C are cross sectional views showing a fabrication process of a semiconductor device in accordance with another embodiment of the present invention.

Referring to FIG. 7A, after a field oxide layer 62 for isolation between devices is formed on a semiconductor substrate 61 through a shallow trench isolation (STI) process, a profiled n well and a profiled p well are formed identical to the first embodiment of the present invention. Dopants implanted to the profiled n well and the profiled p well are activated through a furnace annealing process, so that a triple well formation process is completed. The triple well includes a first p-well 63, a deep n-well 64 adjacent to the first p-well 63 and a second p-well 65 surrounded by the deep n-well 64 and positioned at a predetermined distance with the first p-well 63.

Referring to FIG. 7B, a gate oxide layer 66 and a gate electrode 67 are formed on predetermined portions in the semiconductor substrate 61. After coating a photosensitive layer on the semiconductor substrate 61, which the gate electrode is formed, a first mask is formed by patterning the photosensitive layer through exposing and developing processes to thereby expose the second p well 65, which a cell transistor will be formed thereto. $^{11}$B or $BF_2$ ions are used as the p-type dopant to formed to the threshold voltage ion implantation region 52 and the p-type punch protection region 53. Dose range from the p-type dopant and an ion implantation energy have to be suitable to adjust a threshold voltage of the cell transistor. When the $^{11}$B ions are used, the p-type ion implantation process is carried out with $^{11}$B ions in a concentration of about $5 \times 10^{12}$ ions/cm$^2$ to about $5 \times 10^{13}$ ions/cm$^2$ and in an ion implantation energy ranging from about 80 KeV to about 160 KeV. When the $^{49}BF_2$ ions are used, the p-type ion implantation process is carried out with $^{49}BF_2$ ions in a concentration of about $5 \times 10^{12}$ ions/cm$^2$ to about $5 \times 10^{13}$ ions/cm$^2$ and in an ion implantation energy ranging from about 350 KeV to about 710 KeV.

Referring to FIG. 7C, a source/drain region 48 is formed in the cell transistor by performing a blanket ion implantation process with an n-type dopant without a mask process. A LDD region 49 is formed a region to form an nMOSFET and a pocket region 50 is formed in a region to form a pMOSFET. An ion implantation process of an n-type impurity is carried out with p or As of dose ranging from about $1 \times 10^{13}$ ions/cm$^2$ to about $5 \times 10^{13}$ ions/cm$^2$.

If the source/drain region 71 is formed as mentioned above, the threshold voltage ion implantation region 69 having a channel characteristic is formed beneath of the gate electrode 67. Since the threshold voltage ion implantation region 69 is formed by implanting the p-dopant with a high ion implantation energy, the threshold voltage ion implatation region 69 is not overlapped with the source/drain region 71, which is a cell junction. Therefore, the counter doping effect can be prevented between the source/drain region 71 and the threshold voltage ion implantation region. Accordingly, junction loss of the source/drain region 48 having a junction depth of Xj can be prevented, so that resistance increase and electric field increase are suppressed.

As mentioned above, a fabrication method of the semiconductor device with the triple well structure is described in accordance with the first and second embodiment of the present invention. Also, this method can be applied to a general MOSFET fabrication method.

While the present invention has been described with respect to the particular embodiments, it will be apparent to those skilled in the art that various changes and modifications may be made without departing from the spirit and scope of the invention as defined in the following claims.

What is claimed is:

1. A method for fabricating a semiconductor device, comprising the steps of:
   forming a triple well including a first conductive type well in a semiconductor substrate, wherein a cell transistor is to be formed on the first conductive type well;
   sequentially forming a gate oxide layer and a gate electrode on a triple well;
   forming a source/drain region in the first conductive type well by implanting second conductive type dopant; and
   forming a threshold voltage ion implantation region beneath the gate electrode by implanting first conductive type dopant to the first conductive type well with a ion implantation energy enough to pass through the gate electrode, wherein the threshold voltage ion implantation region surrounds the source/drain region.

2. The method as recited in claim 1, wherein an ion implantation energy for forming the source/drain region is lower than the ion implantation energy forming the threshold voltage ion implantation region.

3. The method as recited in claim 1, wherein the step of forming the threshold voltage ion implantation region is carried out by implanting $^{11}$B as the first conductive dopants with dose ranging from about $5 \times 10^{12}$ ions/cm$^2$ to about $5 \times 10^{13}$ ions/cm$^2$ and an ion implantation energy ranging from about 80 KeV to about 160 KeV.

4. The method as recited in claim 1, wherein the step of forming the threshold voltage ion implantation region is carried out by implanting $^{49}BF_2$ as the first conductive type dopant with dose ranging from about $5 \times 10^{12}$ ions/cm$^2$ to about $5 \times 10^{13}$ ions/cm$^2$ and an ion implantation energy ranging from about 350 KeV to about 710 KeV.

5. The method as recited in claim 1, wherein the step of forming the threshold voltage ion implantation region includes the steps of:
   forming a mask for opening the first conductive type well in the triple well; and
   implanting the first conductive type dopant into the first conductive type well exposed by the mask.

6. The method as recited in claim 1, wherein, in the step of forming the triple well, the triple well includes two first conductive type wells and one second conductive type well, wherein one of first conductive type well is surrounded by the second conductive type well and the other first conductive type well is neighbored with the second conductive type well.

7. The method as recited in claim 1, wherein the first conductive type is a P-type well and the second conductive type is an N-type.

8. A method for fabricating a semiconductor device, comprising the steps of:
   forming a triple well including a first conductive type well in a semiconductor substrate, wherein a cell transistor is to be formed on the first conductive type well;
   sequentially forming a gate oxide layer and a gate electrode on the triple well;
   forming a threshold voltage ion implantation region by implanting a first conductive type dopant into the first conductive type well with an ion implantation energy enough to pass through the gate electrode; and
   forming a source/drain region by implanting a second conductive type dopant into the triple well, wherein the threshold voltage ion implantation region surrounds the source drain region.

9. The method as recited in claim 8, wherein the ion implantation energy for forming the threshold voltage ion implantation region is higher than the ion implantation energy forming the source/drain region.

10. The method as recited in claim 8, wherein the step of forming the threshold voltage ion implantation region is carried out by implanting $^{11}B$ as the first conductive type dopant with dose ranging from about $5\times10^{12}$ ions/cm$^2$ to about $5\times10^{13}$ ions/cm$^2$ and an ion implantation energy ranging from about 80 KeV to about 160 KeV.

11. The method as recited in claim 8, wherein the step of forming the threshold voltage ion implantation region is carried out by implanting $^{49}BF_2$ as the first conductive dopants with dose ranging from about $5\times10^{12}$ ions/cm$^2$ to about $5\times10^{13}$ ions/cm$^2$ and an ion implantation energy ranging from about 350 KeV to about 710 KeV.

12. The method as recited in claim 8, wherein the step of forming the threshold voltage ion implantation region includes the steps of:
   forming a mask for opening the first conductive type well in the triple well; and
   implanting the first conductive type dopant into the first conductive type well exposed by the mask.

13. The method as recited in claim 8, wherein, in the step of forming the triple well, the triple well includes two first conductive type wells and one second conductive type well, wherein one of first conductive type well is surrounded by the second conductive type well and the other first conductive type well is neighbored with the second conductive type well.

14. The method as recited in claim 8, wherein the first conductive type is a P-type and the second conductive type is an N-type well.

* * * * *